United States Patent [19]
Pott et al.

[11] Patent Number: 4,860,254
[45] Date of Patent: Aug. 22, 1989

[54] NON-VOLATILE ELECTRONIC MEMORY

[75] Inventors: Richard Pott, Leverkusen; Aloys Eiling, Bochum; Günther Kämpf, Krefeld, all of Fed. Rep. of Germany

[73] Assignee: Bayer Aktiengesellschaft, Leverkusen, Fed. Rep. of Germany

[21] Appl. No.: 7,048

[22] Filed: Jan. 27, 1987

[30] Foreign Application Priority Data

Jan. 31, 1986 [DE] Fed. Rep. of Germany ....... 3602887

[51] Int. Cl.$^4$ .............................................. G11C 11/22
[52] U.S. Cl. .................................... 365/145; 365/129; 365/182; 357/40; 357/41
[58] Field of Search ............... 365/129, 145, 182, 189; 357/24, 40, 41, 45, 46, 51

[56] References Cited

U.S. PATENT DOCUMENTS

| | | |
|---|---|---|
| 4,149,301 | 4/1979 | Cook . |
| 4,149,302 | 4/1979 | Cook . |
| 4,262,339 | 4/1981 | Geary .................................. 365/145 |
| 4,707,897 | 11/1987 | Rohrer et al. . |

FOREIGN PATENT DOCUMENTS

WO86/04447 of 0000 PCT Int'l Appl. .
WO86/06752 of 0000 PCT Int'l Appl. .

OTHER PUBLICATIONS

Iversen, Wesley R., "A New Memory Technology is About to Hit the Market", Technology to Watch Semiconductors, Electronics/Feb. 18, 1988, pp. 91-95.

Primary Examiner—Terrell W. Fears
Attorney, Agent, or Firm—Sprung Horn Kramer & Wood

[57] ABSTRACT

A volatile semiconductor memory module (RAM) is combined with a permanent memory based on an electrically polarizable, preferably ferroelectric, layer within an integrated monolithic module in such a manner that, as a result of a STORE command, the information present in the semiconductor memory is permanently stored by polarization of selected regions of the electrically polarizable layer. In the same way the permanently stored information can be read out again as a result of a RECALL command and returned to the semiconductor memory. Preferably, a ferroelectrically polarizable layer 11 is applied to the semiconductor memory, which layer, in the same way as the semiconductor memory, is provided on its upper side and underside with word and bit lines in the form of strip electrodes, 9,12. The strip electrode system 9 on the underside of the ferroelectric layer 11 simultaneously forms the word or bit line system of the semiconductor memory facing the surface. In this manner each semiconductor memory cell 7 is clearly allocated a non-volatile ferroelectric memory cell 13.

8 Claims, 4 Drawing Sheets

NON-VOLATILE ELECTRONIC MEMORY

The invention is based on an electronic semi-conductor memory with word lines and bit lines for selectivel addressing the memory cells (RAM). Such a memory combines in itself the properties of great storage density, a high writing/reading speed as well as random access into the memory cells. However, the stored information is not permanently present, i.e. the memory has to be activated periodically or at least subjected to a voltage in order to obtain the information state.

The semi-conductor memories which are conventional nowadays can be divided into two large groups:

1. The volatile RAM's (Random Access Memory) such as SRAM (Static RAM) and DRAM (Dynamic RAM) which are used with high storage density (1 Mb), very fast access time during the writing and reading process (<100 ns) and random access mainly as a working memory for computers and
2. The non-volatile ROM's (Read Only Memory) such as EPROM (Electrically Programmable ROM) and EEPROM (Electronically Erasable PROM) which, unlike the RAM's, retain their information even when the supply voltage fails or is switched off, with comparatively distinctly higher installation costs and relatively low storage capacity and substantially lower writing speeds.

In the past, the combination of CMOSRAM's (CMOS owing to the low power requirements) with a battery for the emergency power supply was employed as a solution for a non-volatile memory with the property spectrum of a RAM. However, this procedure is only an emergency solution because the batteries have a restricted service life, increase the weight of the system, demand additional space and are not sufficiently reliable, in particular, in critical (for example security-related or military) applications.

A further solution which has existed since the beginning of the eighties is the so-called NVRAM (Non-Volatile RAM; produced by XICOR 1979; D. G. Craycroft, U.S. Pat. No. 4,271,487 (1981)). The NVRAM has the advantages of both groups owing to the combination of RAM cells with non-volatile memory cells. However, the NVRAM has the great disadvantage of by far the highest installation costs of all memory modules. If one ignores the costs and the greater amount of space required compared with the RAM's, then the NVRAM's represent the ideal memory modules as they have the high writing and reading speed of RAM's combined with the non-volatility of the ROM's. A SRAM is usually inserted in a NVRAM as the RAM constituent so that two cells with a total of none components have to be provided for each bit (6 for the SRAM, 1 for the EEPROM and 2 more selection transistors). A conventional NVRAM therefore has only about 10% of the memory capacity of a DRAM per unit area and this is a decisive cost disadvantage. A further disadvantage (but less serious depending on the circumstances) is the restricted writing cycle count of the non-volatile memory region. If all these arguments were considered, then a non-volatile DRAM would be ideal. If it were possible to develop such a non-volatile DRAM, all other types of semi-conductor memory and, in many cases, also the magnetic memories nowadays used as mass memories (for example Floppy Disc) would automatically become superfluous.

Memories based on electrically polarisable layers have been developed since the beginning of the fifties, having initially been developed in the same ways as magnetic memories (W. S. Merz, J. R. Anderson, Bell Laboratories Record 33, 335–342 (1955). At the beginning of the seventies Crawford (J. C. Crawford, Ferroelectrics 3, 139–146 (1972)) then described a ferroelectric memory arrangement which was relatively compatible with the semiconductor memories of that time. Using a similar method to that described by Merz and Anderson this memory was obtained by vaporising electrode strips on the upper and lower side of a ceramic ferroelectric layer (PZT) rotated by 90° to one another.

Information could be stored by applying a voltage to corresponding electrodes on the upper and lower side (corresponding to the lines and column addresses in the case of semiconductor memories), thereby polarising the region in the point of intersection of these electrodes. The readout process can then be carried out, for example, by piezoelectric or pyro-electric activation of certain memory regions or by destructive readout. The advantage of such a memory in comparison with the conventional Si memories lies in the potentially greater storage density. However, very high requirements with respect to switching speed, freedom from fatique, rectangular hysteresis curve etc. are imposed on the ferroelectric layer for this purpose. In addition the peripherals, i.e. the control electronics necessary for writing in and reading out the information proved to be relatively complicated and time-consuming. Consequently at the end of the seventies the proposal was made to integrate a ferroelectric memory element directly on to or with a control module (R. C. Cook, U.S. Pat. No. 4,149,302 (1979)). This does not however avoid the abovementioned fundamental problems of ferroelectric memories with respect to switching speed, freedom from fatique, rectangular hysteresis curve etc., since the storage capacity of this integrated module is based entirely on the ferroelectric effect. In addition the problem of contamination makes it very difficult, if not impossible, to master the proposed use of $KNO_3$ as a ferroelectric storage layer in semiconductor manufacturing processes. All in all these problems prevented ferroelectric memories from progressing from the development stage. Other worthwhile non-volatile memories based on ferroelectric layers had also already been discussed very early on (I. M. Ross, U.S. Pat. No. 2,791,760 (1959)), in which the ferroelectric layer assumes the function of the gate-oxide of a field effect transistor (FET) and the state of the transistor can be controlled continuously by means of the residual polarisation. These so-called FEFET's (ferroelectric FET) have not been successful in the past, however, although they would potentially represent a very attractive non-volatile memory element.

It was accordingly an object of the invention, by the combination of a DRAM or also SRAM with a non-volatile memory based on an electrically polarisable layer, to develop a memory which combines the advantages of the RAM's with the non-volatility of such a memory in a single integrated memory module.

Starting with a conventional DRAM or SRAM memory module, this object is achieved according to the invention in that a polarisable ferroelectric layer is applied to the slightly modified DRAM (SRAM), the layer also being provided on its upper side and under side with word and bit lines in the form of strip electrodes, and the strip electrode system on the underside simultaneously forms the word or bit lines system of the memory module facing the surface or is electrically connected to it so that a non-volatile ferroelectric memory cell is clearly allocated to each memory cell of the memory module. The ferroelectric layer thus fulfils the function of a second, and in fact permanent, memory which is integrated in the third dimension on the RAM and forms, together with the RAM, the novel, integrated non-volatile memory module.

This new memory module, which could be called FERAM (ferroelectric RAM) therefore consists of two memory regions, the first memory region being allocated to the volatile RAM and the second memory region to the non-volatile memory based on the electrically polarisable ferroelectric layer. The FERAM combines two memory technologies in one single module. In normal operation only the first memory region of this FERAM is activated, i.e. the FERAM operates as a conventional RAM (DRAM or SRAM) and thus also possesses the desired property spectrum of the RAM's with respect to readin and readout speed, free addressability and storage density. The information present in the first memory region is transferred into the second memory region only in certain instances. This takes place, as with the NVRAM's, for example merely when switching off the computer, during a power failure or on the basis of a particular STORE command. Similarly the information deposited permanently in the second memory region can be transferred to the first memory region, the RAM part, for example when the power supply is switched on again or due to a particular RECALL command.

In this arrangement, the semi-conductor memory comprises an almost complete conventional RAM based on a NMOS or CMOS, i.e. the production processes normally used for producing current RAM's can be adopted almost completely for the semiconductor memory. Essentially only the last process step, which has to be carried out for the passivation of the chip, is omitted. The word or bit line applied to the surface according to the processing technology is then used as the lower strip electrode of the non-volatile ferroelectric memory region. Alternatively, the word/bit line system facing the surface can also be connected electrically via contact webs to the strip electrode system applied to the under side of the ferroelectric layer.

There are basically two possible ways of applying the ferroelectric memory layer of the second memory.

The unevenness normally present on the semiconductor memory due to the folded architecture of the bit/word lines is eliminated by levelling the surface of the RAM by means of a passivating layer and applying the ferroelectric layer to it. Only a few selected regions of the word or bit line are then in direct contact with this layer.

The other alternative involves not eliminating the above-mentioned unevenness, but applying the ferroelectric layer directly onto the word/bit line system. There are two further alternatives for the subsequent procedure. Either the upper side of the ferroelectric layer is levelled by appropriate planarising (levelling) steps using an inert material or the ferroelectric layer is applied in such a thickness that sufficient planarity is present, the layer thickness required for reading in and out being adjusted by appropriate etching.

The electrically polarisable layer is applied by suitable methods such as evaporation, sputtering, CVD (chemical vapour deposition) etc, in the case of inorganic electrically polarisable layers or preferably by spin coating in the case of organic polarisable layers. However, the Langmuir Blodgett method can also be adopted for applying molecular electrically polarisable layers.

These coating methods are conventional in the production of semi-conductor components and are described, for example, by P. O. Hagan, W. J. Daughton in Circuits Manufacturing 18, 71 (1978) and also in a report by G. G. Roberts, Insulating Films on Semiconductors, Pages 56–67, edited by M. Schulz and G. Penzel; Published by Springer Verlag Berlin, Heidelberg, New York 1981.

The upper strip electrode required for readin/ readout but which need not necessarily be rotated by 90° relative to the lower strip electrode (bit/word line) owing to the above-mentioned unevenness, is applied to this electrically polarisable ferroelectric layer again by a suitable standard processing step (for example photosensitive resist, exposure, development, etching, evaporation or sputtering or CVD of metal (Al) or silicides. The semiconductor memory and the ferroelectric memory pass into one another fleetingly. This means that the average area requirement of a FERAM is identical to that of the basic RAM.

In the inorganic case, it is preferable to use ferroelectric materials such as triglycine sulphate (TGS), barium titanate (BaTiO$_3$), lead/zirconium titanate (PLZT), bismuth titanate (Bi$_4$Ti$_3$O$_{12}$) etc, as electricaly polarisable layers. Polymers with readily polarisable atoms such as polyolefins with fluorine atoms such as polyvinylidene fluoride (PVDF) or polymers having highly polarisable end groups such as polyvinylidene cyanide (PVCN) are preferably used as organic layers. The optimisation of these electrically polarisable layers, which may be necessary in some case, can be effected by copolymers of PVDF with PVF$_3$, TrFE or blends with polymethyl methacrylate or copolymers of PVCN with polyvinyl acetate among others. Electrically polarisable Langmuir Blodgett Films are preferably composed of substances having the following structural formulae

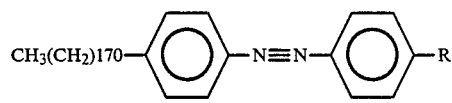

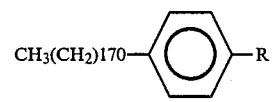

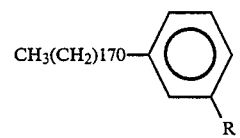

wherein the end group R can be OH, CN, NO$_3$, COOH, SO$_2$NH$_2$, SO$_2$N(C$_2$H$_5$)$_2$, or

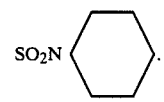

With the memory module according to the invention, the following advantages over the current NVRAM's are achieved:

- the FERAM is a non-volatile memory with DRAM properties with respect to storage density, writing/reading speed and free addressability, the specific memory capacity being greater by a factor of ten than with current NVRAM's
- the production costs are therefore much lower than for the NVRAM's
- the non-volatile memory cycle number is not restricted in comparison with the NVRAM's.

Compared with a purely ferroelectrically based memory the requirements for the material with respect to switching time, rectangularity of the hysterisis curve, etc. are substantially less critical. Furthermore, compatibility with the present memory generation is ensured.

The inventio is described in more detail below with reference to drawings and embodiments.

Figure 1:
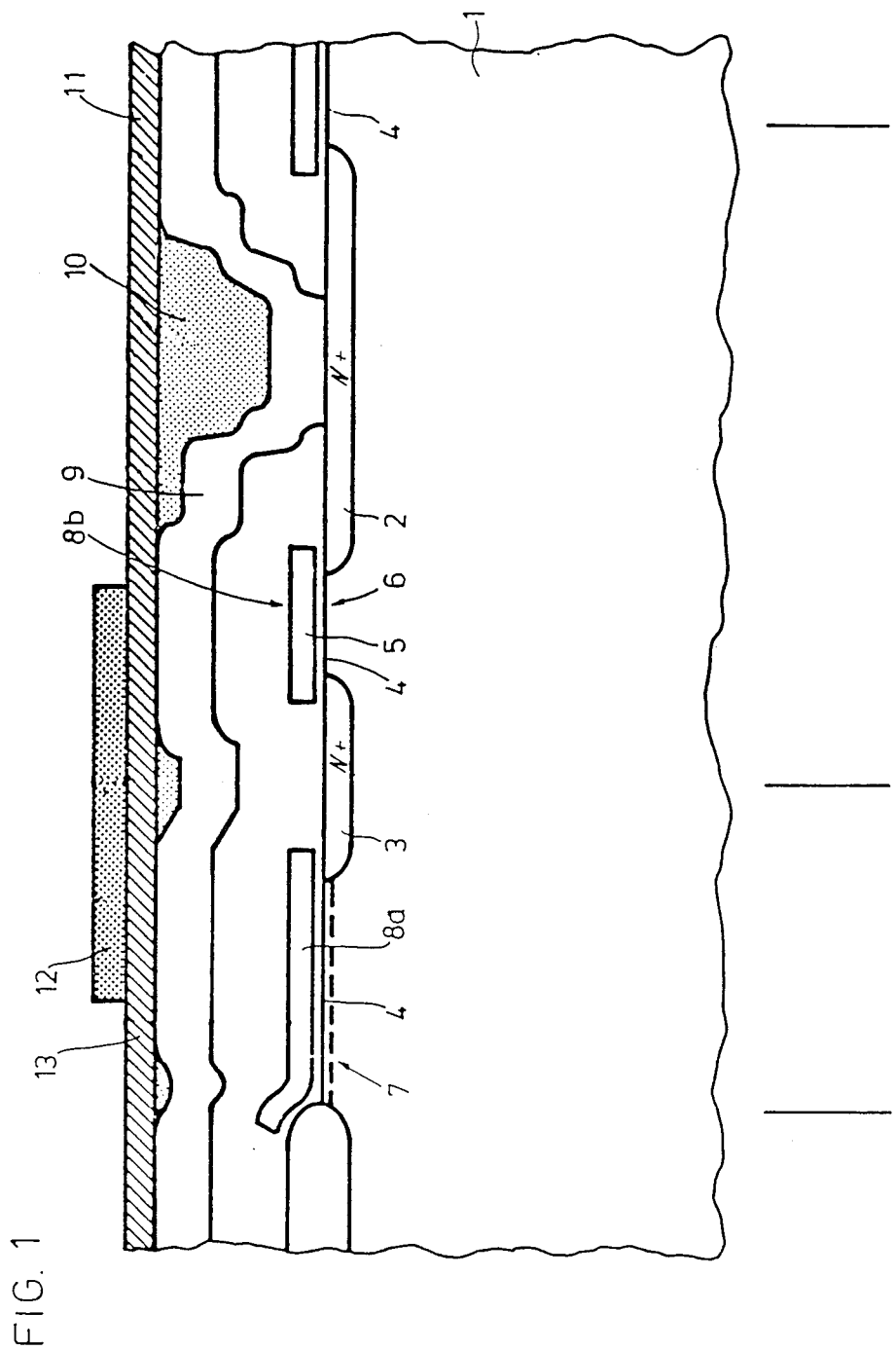
FIG. 1 shows a cross section through a memory cell of a dynamic NMOS-based semiconductor memory DRAM with the associated integrated ferroelectric memory cell.

The memory element shown in FIG. 1 is built up by the NMOS method. Regions 2, 3 which are n-doped on the surface are implanted in the p-doped Si substrate 1 and covered with a $SiO_2$-layer (Gate Oxide) 4. The n-doped zones together with the gate electrode 5 form the selection transistor 6 for activation of the memory element. The actual memory element consists of the capacitor 7 indicated on the left-hand edge of the figure and implanted into the substrate 1. The lower electrode of the capacitor is connected to the n-channel 3. The other electrode of the memory capacitor 7 is the polyword line 8a. The n-channel 2 of the selection transistor 6 is contacted by the metal bit line 9 at the other end of the memory cll. The gates 5 of the selection transistors 6 form the other word line 8b for the memory capacitor 7. The word lines 8a, 8b are arranged orthogonally (perpendicularly to the plane of the drawing) to the bit lines 9 running in a longitudinal direction. By selecting a specific selection transistor 6 via the word line 8b, any desired memory capacitor 7 together with a predetermined bit line 9 can be addressed by means of known circuit techniques. The polyword lines 8a, 8b thus form together with the bit lines 9, a matrix for addressing the memory elements.

The unevenness remaining on the memory module is smoothed with an inert material 10 which can simultaneously serve for passivation. $SiO_O$, $Si_3N_4$, $SiOxN_y$ or polyimide can for example be used as the material 10. For smoothing the surface after the layer 10 has been applied a resist (not shown in the figure) is typically applied thickly by spin coating and is then removed again by etching until the original structure is laid bare. For this purpose an etching technique is used for which both the resist and the inert material have the same etching rate (e.g. ion beam milling at specific angles). The ferroelectric material 11 is applied to the surface prepared in this manner. In order to avoid contamination problems an organic ferroelectric such as polyvinylidene fluoride (PVdF) or a copolymer such as PVdF/TrFE (TrFE trifluorethylene) is preferably used. Strip electrodes 12 running parallel to the polyword lines 8a, 8b are evaporated on the upper side of the ferroelectric memory layer. The strip electrode 12 together with the bit line 9 passing on the underside of the ferroelectric layer 11 forms a ferroelectric memory cell 13. The ferroelectric memory is therefore integrated onto the semiconductor surface as a backup memory so to speak.

In contrast to the volatile semiconductor memory A (FIG. 4) the information can be deposited permanently in the ferroelectric memory B.

Figure 2:
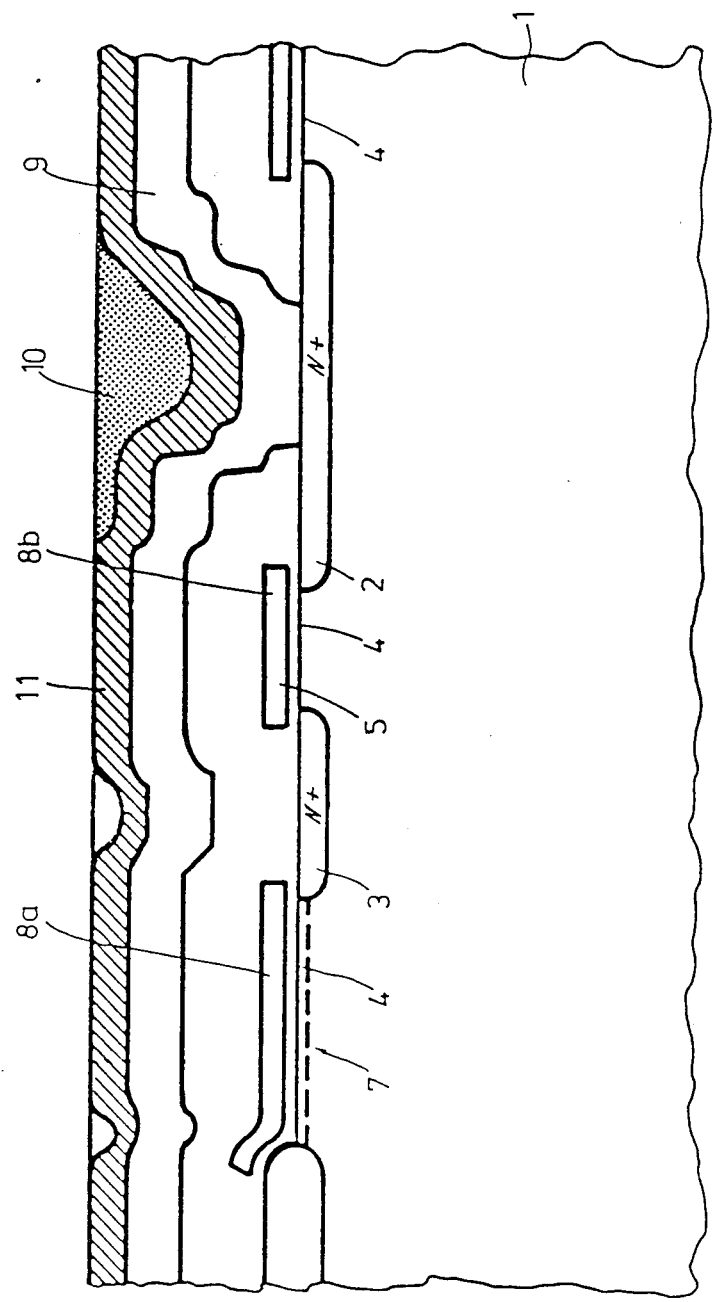
FIG. 2 shows a memory cell made up similarly to FIG. 1 but with the ferroelectric layer applied directly (without prior planarisation) to the semiconductor memory.

FIG. 2 shows an alternative design of the combined ferroelectric semiconductor memory (FERAM). The same semiconductor memory as in FIG. 1 forms the basis of this design. In contrast to FIG. 1, however, the ferroelectric memory layer is applied directly to the bit lines 9. The unevenness on the surface of the ferroelectric memory is again compensated by an inert passivation layer 10 according to the above-described method. The upper strip electrodes are then applied to this smoothed surface.

Figure 3:
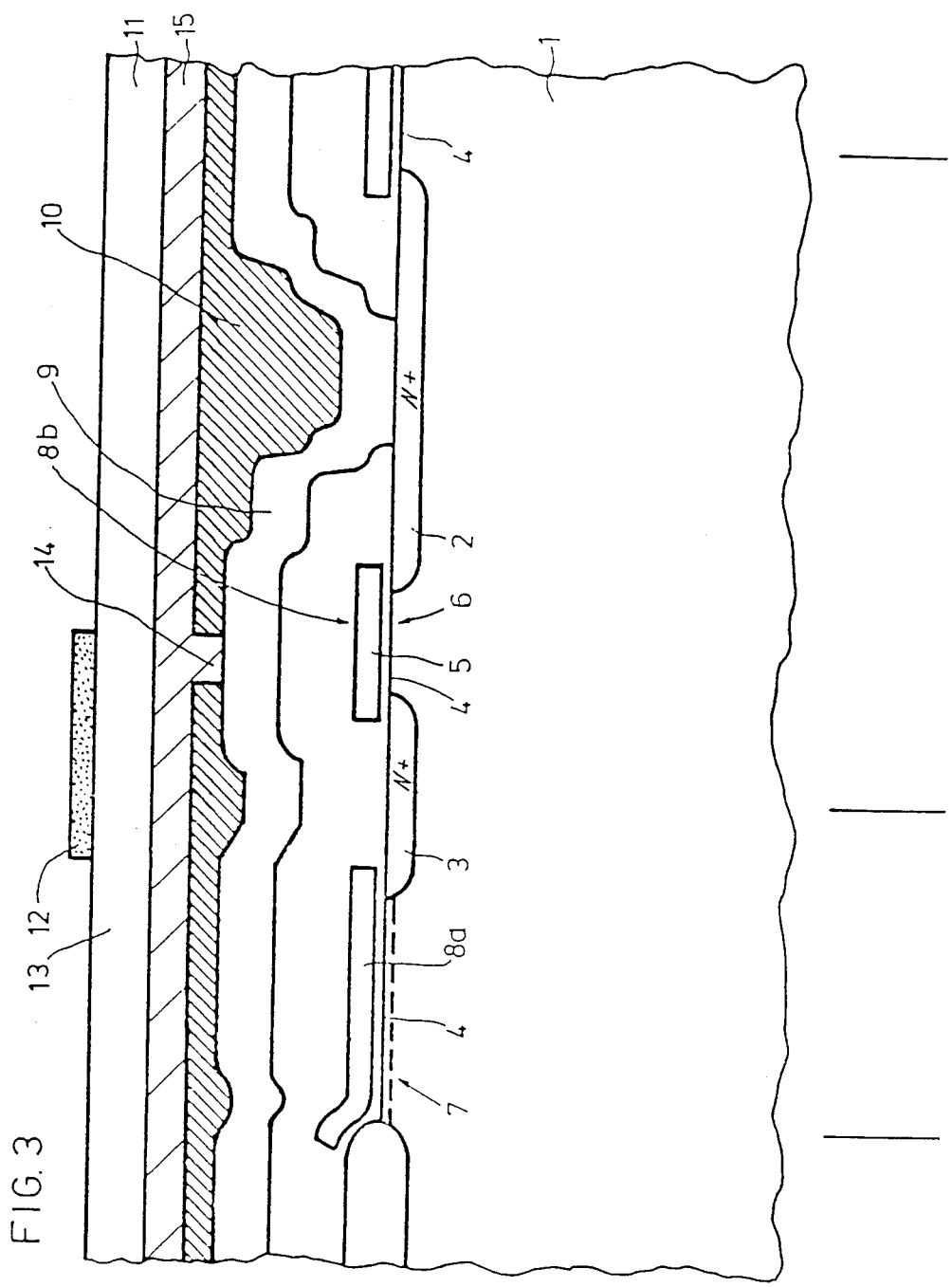
FIG. 3 shows an alternative design of the memory unit according to FIG. 1 in which the word/bit line system on the under side of the ferroelectric layer is connected via contact webs to the word/bit line system on the surface of the RAM memory cell.

In both cases (according to FIG. 1 and FIG. 2), the bit line system 9 lying on the top of the semiconductor surface simultaneously forms the lower strip electrode system of the ferroelectric memory. However, this is not an essential condition. Rather, as shown in FIG. 3, the bit line system 9 can be connected via contact webs 14 to the lower strip electrode system 15 of the ferroelectric memory.

EMBODIMENT EXAMPLE NO. 1

PVdF is brought into solution in DMF (dimethyl formamide) with slight heating. We used solutions with a per cent by volume content of less than 10%, and typically 1%. The solutions prepared in this manner are spun on to the prepared wafer using a standard spin coater (CONVAC 101). For a desired layer thickness of about 0.1 $\mu$m and depending on the viscosity of the solution a typical speed of rotation of a few hundred of a few thousand revolutions per minute is used. The wafer coated in this manner is then typically tempered in a drying cupboard for 60 minutes at between 40° and 260° C. Tempering is preferably carried out at a temperature of between 180° and 220° C. The thickness of the PVdF film was determined using an ellipsometer (Gaernter Scientific Corporation) and the capacity was also examined. Thickness of between 0.03 min and 1.5$\mu$m were determined, the variation in thickness for a 4 inch wafer being found to be less than 10% in the case of a typical thickness of 0.1 $\mu$m. The surface roughness Ra was determined to be less than 0.02 $\mu$m using a brush analyser (Sloan Technology Corporation). Since the PVdF memory layer produced in this manner is in the form of a ferroelectrically inadequate phase the desired ferroelectrically active phase I (also referred to as b) is then established by means of corona polarisation in the region of the lower strip electrode which is connected to earth. For purposes of characterisation this layer was removed and identified as phase I by means of IR spectroscopy.

EMBODIMENT EXAMPLE NO. 2

Copolymers of PVdF/TrFE with compositions of 60/40 and 75/25 were brought into solution with slight heating in DMF and in acetone. Typically a per cent by volume content of less than 10% was used. The solution is then spun on the prepared, planarised wafer using the spin-coater and then tempered immediately. For the samples dissolved in DMF a tempering tempeature of higher than 100° C. was used, a temperature of between 140° and 220° C. preferably being regulated. For the samples dissolved in acetone a tempering temperature of lower than 180° C. was used, the temperature preferably settling at between 60° and 140° C. The tempering period is typically one hour in both cases. The layer thickness dependent on the viscosity of the starting solutions and the selected rotational frequency of the spin-coater were determined to be between 0.02 $\mu$m and 2 $\mu$m. The surface roughness was lower than 0.02 $\mu$m for a typical layer thickness of 0.1 $\mu$m and the variation in thickness was typically less than 10%.

The etching of the PVdF and PVdF/TrFE layers necessary for the subsequent procedure such as application of the strip electrode by evaporation and contacting is carried out wet-chemically using the appropriate solvent. Standard dry etching processes can also be used.

Figure 4:
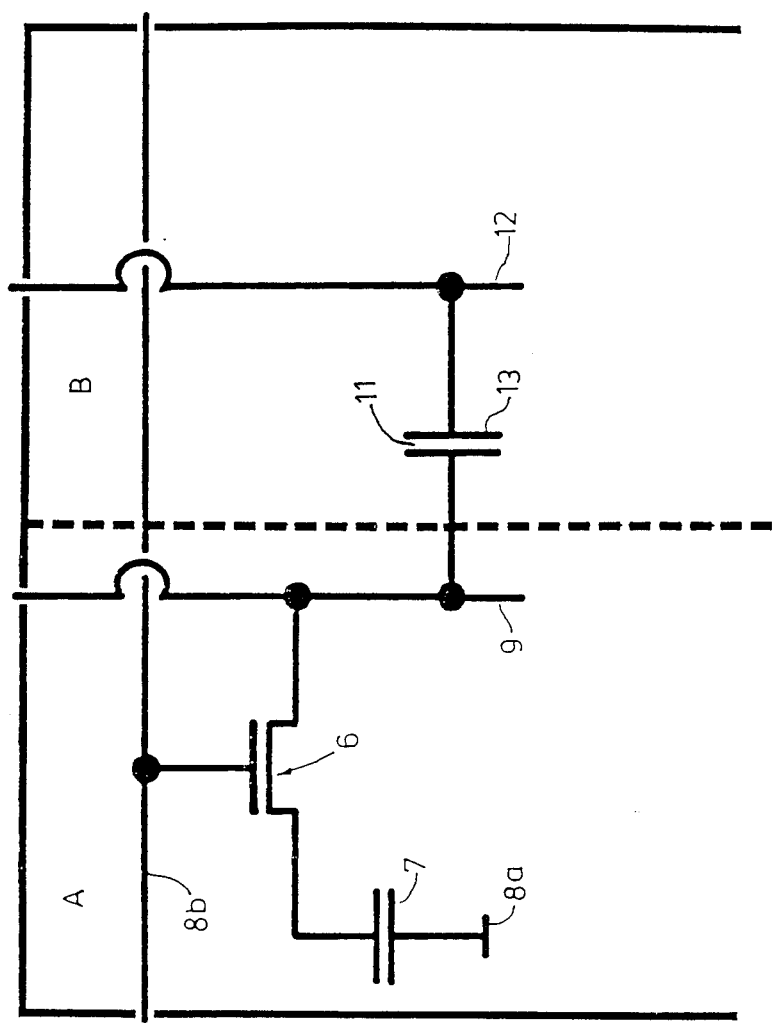
FIG. 4 shows the equivalent circuit of memory cell according to FIGS. 1 to 3.

The mode of operation of the combined ferroelectric semiconductor memory (FERAM) is described below with reference to FIG. 4. In particular, the writing/reading process in the non-volatile ferroelectric memory region B is discussed. Details are given merely of the process taking place in the memory cell, i.e. the circuits required for the differing addressing of the semiconductor RAM A and the ferroelectric memory B are not described in detail. Furthermore, they can be made up in a similar manner to the NVRAM's and correspond to the prior art.

A basic distinction must be made between the writing/reading processes taking place in the two memory regions. As the writing/reading process in the volatile memory region A corresponds to the prior art, it is not discussed further here.

Now if the memory region B is addressed by means of a STORE command resulting from a collapse of the power supply or of an explicit software command, the information present in memory region A at this moment is taken over into the memory region B in the following manner—here we are concentrating on a single memory cell without restricting the general nature (See FIG. 4). The information present in the charge memory 7 of the memory region A is supplied to the scanning and refresh amplifier by activation of the world line 8 b of the selection transistor 6 by means of the corresponding bit line 9. Shortly afterwards, the addressing of the word line 8a is changed over to the upper strip electrode 12 so that by means of the activated bit line 9 or the lower strip electrode 14 and the upper strip electrode 12 the electrically polarisable layer 11 available in the region of intersection of the two lines is permanently polarised by application of a voltage U. This voltage U must obviously be selected sufficiently high for polarisation actually to take place, i.e. U/d (d is the thickness of the electrically polarisable layer) must be greater than the corresponding material coercive force field intensity. $\pm U/2$ is preferably adopted to prevent re-polarisation of adjacent memory cells (due to parasitic coupling capacitances). This means, for example, that with inorganic ferroelectric materials having typical coercive field intensities of 0.1 V/$\mu$m at a voltage U=5 V, a layer thickness of about 30 $\mu$m must be adjusted. With organic ferroelectric materials, such as PVdF or PVdF/TrFE, on the other hand, the coercive field intensity is typically 50 V/$\mu$m so that layer thicknesses of less than 0.1 $\mu$m are desired. It was surprisingly found that the coercive field intensity, in particular in the case of layer thicknesses of less than 0.5 $\mu$m, is also dependent on thickness, so that this effect must also be taken into consideration. It is however also possible, and in most cases advantageous, to produce a higher voltage on the chip (up to about 20 V), so that greater layer thicknesses can be applied and polarised in the writing/reading process of the memory region B. In particular the susceptibility of the ferroelectric memory layer towards interfering voltages is reduced by this method.

The transfer of the data deposited in the non-volatile memory region B into the volatile memory region A can take place either automatically when the supply voltage is switched on or by software by means of a RECALL command. This is achieved by destructive readout in the form of a recording process of the memory element 13 in the memory region B. The charge supplied to the scanning and refresh amplifier according to the information deposited is evaluated as binary information (0 or 1) and then subsequently deposited in the associated memory element 7 of the memory region A by activation of the word line 8b in the scope of a normal refresh cycle. The charge liberated during the destructive readout is about 10 mc/cm$^2$ with inorganic ferroelectric materials so that a charge of about 10$^6$ electrons is liberated with an area of 10 $\mu$m$^2$. A similar value is also observed with the polymers. The order of magnitude of this charge is quite comparable with the charge liberated during readout of the charge capacitor of the memory region A so that detection is immediately possible in terms of circuitry according to the prior art. The information which is available in inverted form after destructive readout is returned directly to the memory region B by means of a special circuit. Other readout methods which are conventional in ferroelectric memories, for example by means of piezo- or pyroelectric activation, on the other hand, liberate substantially less charges (factor 100) making detection possible but difficult.

We claim:

1. A non-volatile integrated electronic memory module comprising a volatile semiconductor memory module (RAM) region and a permanent memory electrically polarisable ferroelectric layer region within an integrated monolithic module and means to retrieve and transfer information from said ferroelectric layer to the RAM and from said RAM to said ferroelectric layer.

2. A non-volatile electronic memory module according to claim 6, wherein the electrically polarisable ferroelectric layer is composed of a polymer with fluorine atoms.

3. A non-volatile electronic memory module according to claim 1, wherein said electrically polarisable ferroelectric layer (11) is applied to the RAM with word and bit lines for selective addressing of the memory cells, which layer is also provided on its upper side and under side with word lines (12) or bit lines (9, 15) in the form of strip electrodes, and the strip electrode system on the under side at the same time forms the word or bit line system (9) of the RAM facing the surface or is electrically connected to it so that each semiconductor memory cell (7) is clearly allocated a non-volatile ferroelectric memory cell (13).

4. A non-volatile electronic memory module according to claim 3, wherein the surface of the semiconductor memory with the word or bit lines (9) arranged thereon is levelled by a planarisation layer (10) onto which the electrically polarisable ferroelectric, layer (11) is applied.

5. A non-volatile electronic memory module according to claim 3, wherein the electrically polarisable ferroelectric, layer (11) is applied directly to the semiconductor surface and the upper side of the electrically polarisable ferroelectric, layer (11) is levelled with a planarisation layer (10).

6. A non-volatile electronic memory module according to claim 3, wherein the word—bit line system (9) facing the surface is electrically connected via contact webs (14) to the strip electrode system (15) additionally applied to the under side of the ferroelectric layer (11).

7. A non-volatile electronic memory module according to claim 1, wherein the electrically polarisable ferroelectric, layer (11) is composed of a polymer with readily polarisable atoms or of a polymer with highly polarisable end groups.

8. A non-volatile electronic memory module according to 6, wherein the electrically polarisable ferroelectric, layer (11) is composed of polyvinylidene fluoride or polyvinylidene cyanide or copolymers of polyvinylidene fluoride with polyvinyl trifluoride (PVF$_3$) or trifluoroethylene or blends with polymehtyl methacrylate.

* * * * *

UNITED STATES PATENT AND TRADEMARK OFFICE
CERTIFICATE OF CORRECTION

PATENT NO. : 4,860,254
DATED : August 22, 1989
INVENTOR(S) : Richard Pott, et al It is certified that error appears in the above-identified patent and that said Letters Patent is hereby corrected as shown below:

| | |
|---|---|
| Col. 1, line 54 | Delete "none" and substitute --nine-- |
| Col. 2, line 3 | Delete "ways" and substitute --way-- |
| Col. 5, line 18 | Correct --invention-- |
| Col. 5, line 50 | Delete "cll" and substitute --cell-- |
| Col. 5, line 63 | Delete "$SiO_O$" and substitute --$SiO_2$-- |
| Col. 6, line 8 | Correct spelling of --trifluoroethylene-- |
| Col. 6, line 55 | Delete "Thickness" and substitute --Thicknesses-- |
| Col. 8, line 56 and Col. 10, line 10 | Delete "claim 6" and substitute --claim 7-- |
| Col. 10, line 14 | Correct spelling of --polymethyl-- |

Signed and Sealed this

Thirtieth Day of October, 1990

Attest:

HARRY F. MANBECK, JR.

Attesting Officer

Commissioner of Patents and Trademarks